(12) United States Patent
Chun et al.

(10) Patent No.: US 6,866,986 B2
(45) Date of Patent: Mar. 15, 2005

(54) METHOD OF 193 NM PHOTORESIST STABILIZATION BY THE USE OF ION IMPLANTATION

(75) Inventors: Jun Sung Chun, Fremont, CA (US); Mehran Sedigh, Campbell, CA (US); Christ Ford, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 22 days.

(21) Appl. No.: 10/191,546

(22) Filed: Jul. 10, 2002

(65) Prior Publication Data

US 2004/0009437 A1 Jan. 15, 2004

(51) Int. Cl.[7] .............................. G03F 7/26; G03F 7/40
(52) U.S. Cl. ........................ 430/311; 430/322; 430/327
(58) Field of Search ................. 430/311, 313, 430/322, 323, 327; 216/41

(56) References Cited

U.S. PATENT DOCUMENTS

| | | | |
|---|---|---|---|
| 3,666,473 A | 5/1972 | Colom et al. ............... 430/192 |
| 4,115,128 A | 9/1978 | Kita ........................... 430/191 |
| 4,173,470 A | 11/1979 | Fahrenholtz et al. ........... 430/5 |
| 6,319,655 B1 | 11/2001 | Wong et al. ................. 430/311 |
| 2002/0013055 A1 * | 1/2002 | Yamaguchi et al. ......... 438/689 |
| 2003/0000920 A1 * | 1/2003 | Lee ............................. 216/41 |
| 2003/0045071 A1 * | 3/2003 | Hong et al. ................. 438/427 |

* cited by examiner

Primary Examiner—Kathleen Duda
(74) Attorney, Agent, or Firm—Steven B. Kelber; DLA Piper Rudnick; Gray Cary US LLP

(57) ABSTRACT

A method of forming a photoresist includes forming a photoresist and patterning/developing it according to conventional methods. The photoresist is then subjected to ion implantation. The ions may be selected from the group consisting of argon, boron, boron fluoride, arsenic, phosphorous and nitrogen. The ion implantation during processing of the photoresist provides a stabilized photoresist and helps reduce CD loss, loss of the photoresist and formation of pin holes and striations.

11 Claims, 1 Drawing Sheet

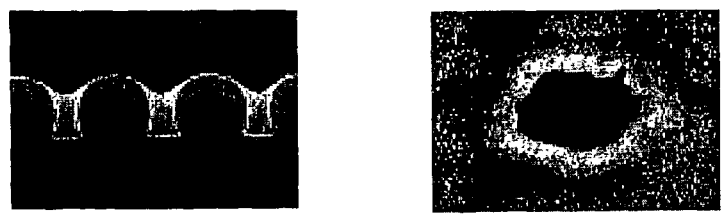
Fig. 1. A) Resist flow at 128C bake, b) pattern deformation after dry etch; 360nm contact hole size and baked at convection oven
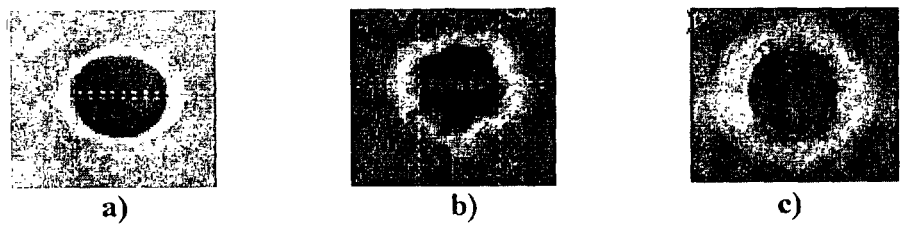
Fig. 2 a) Original contact hole pattern on BPSG film, b) contact hole pattern after dry etch, c) Ar implanted contact hole pattern after dry etching ; energy of 50KeV and dose of 5X10E15 ions/sq.cm

METHOD OF 193 NM PHOTORESIST STABILIZATION BY THE USE OF ION IMPLANTATION

BACKGROUND OF THE INVENTION

1. Field of the Invention

The present invention relates to the field of semiconductor devices and, more particularly, to photoresists and to a method of stabilizing 193 nm photoresists by implanting ions therein.

2. Discussion of the Technology

The production of photoresists is well known in the art as exemplified in, for example, U.S. Pat. Nos. 3,666,473; 4,115,128 and 4,173,470. Generally, these photoresists contain aqueous alkali soluble polyvinyl phenol or phenol formaldehyde novolak resins together with light sensitive materials, usually a substituted naphthoquinone diazide compound. The resins and sensitizers are dissolved in an organic solvent and are applied as a thin film coating to a substrate suitable for the particular application desired. The resin component of photoresist formulations is soluble in an aqueous alkaline solution, but the photosensitizer is not. Continuing with the process, the photoresist may then be subjected to a baking step often called a "soft-bake." Next, the photoresist is selectively exposed to a form of radiation such as ultraviolet (UV) light, electrons or x-rays in order to create a latent image on the resist, optionally followed by a post-exposure bake. Upon the imagewise exposure of the coated substrate to radiation, the exposed areas of the coating are rendered more soluble than the unexposed areas. The difference in solubility causes the exposed areas of the photoresist coating to be dissolved when the substrate is subsequently immersed in a developing solution, while the unexposed areas are substantially unaffected, thereby producing a positive image on the substrate. Areas of the substrate from which the photoresist has been removed can be subjected to a variety of subtractive (i.e., etching) or additive (i.e., ion implantation) processes that transfer the pattern onto the substrate surface. Frequently, the etching involves a plasma etching against which the resist coating must be sufficiently stable. Because photoresist coating protects the covered areas of the substrate from the etchant, the etchant is only able to etch the uncovered areas of the substrate. A pattern, therefore, can be created on the substrate. The pattern on the substrate corresponds to the pattern of the mask or template that was used to create selective exposure patterns on the coated substrate prior to development. Ion implantation is a process in which energetic, charged atoms (or molecules) are directly introduced into a substrate. It is primarily used in VLSI and ultra large scale integration (ULSI) fabrication to add dopant ions into the surface of silicon wafers. The photoresists are used as a masking material so that dopants can be introduced into selected regions (i.e., those not covered by the photoresist).

The photoresist may also subsequently be subjected to one or more post-development steps. For example, a post-development bake is a process in which the resist is subjected to an elevated temperature upon completion of development and prior to etching. Its chief functions are to remove residual solvents, to improve adhesion and to increase the etch resistance of the photoresist. After or during post-development baking, photoresists may be subjected to an additional stabilization process. This stabilization is a photostabilization process typically done using a combination of UV radiation and heat. Photostabilization makes the photoresist less susceptible to erosion and prevents bubbling and blistering in the resist film. These methods, however, are no longer effective for 193 nm resists because of the nature of the resists (i.e., increased instability and sensitivity). For example, the current generation of 193 nm photoresists suffers from severe instability under plasma conditions for various etching processes including high aspect ratio, self-aligned contact and gate etches. Such instability is problematic because it results in surface damage to the photoresist (i.e., pin holes), a loss of photoresist (i.e., low selectivity) and/or critical dimension and formation of striations, which subsequently leads to problems during plug fill. In particular, current ArF 193 nm photoresists are very "soft" in nature and causes raggedness, striation and pin holes during the etch of the underlying wafer layers.

The ability to reproduce very small dimensions is extremely important in the production of large scale integrated circuits on silicon chips and similar components. As the integration degree of semiconductor devices becomes higher, finer photoresist film patterns are required. One way to increase circuit density on such a chip is by increasing the resolution capabilities of the resist.

The optimally obtainable microlithographic resolution is essentially determined by the radiation wavelengths used for selective irradiation. The resolution capacity that can be obtained with conventional deep ultraviolet microlithography, however, has its limits. In order to be able to sufficiently resolve optically small structural elements, wavelengths shorter than deep UV radiation must be utilized. The use of UV radiation has been employed for many applications, particularly radiation with a wavelength of 193 nm. In particular, the radiation of an argon fluoride (ArF) excimer laser, which has a wavelength of 193 nm, is useful for this purpose. The deep UV photoresist materials that are used today, however, are not suitable for 193 nm exposure. Materials based on phenolic resins as a binding agent, particularly novolak resins or polyhydroxystyrene derivatives, have too high an absorption at wavelengths below 200 nm and one cannot image through films of the necessary thickness. This high absorption at 193 nm radiation results in side walls of the developed resist structures that do not form the desired vertical profiles. Rather, they have an oblique angle with the substrate, which causes poor optical resolution characteristics at these short wavelengths.

Chemical amplification resist films have been developed, which have been found to have superior resolution. The chemistry of a 193 nm photoresist is based on polymers such as, but not limited to, acrylates, cyclic olefins with alicyclic groups and hybrids of the aforementioned polymers which lack aromatic rings, which contribute to opacity at 193 nm. It has, therefore, been known to utilize photoresists based on methacrylate resins for the production of microstructures by means of 193 nm radiation.

Chemically amplified resist films, however, have not played a significant role in the fine pattern process using deep UV because they lack sufficient etch resistance, thermal stability, post exposure delay stability and processing latitude. While such photoresists are sufficiently transparent for 193 nm radiation, they do not have the etching stability for plasma etching that is customary for resists based on phenolic resins. A typical chemical amplification photoresist film comprises a polymer, a photoacid generator and other optional additives. The polymer is required to be soluble in the chosen developer solution and to have high thermal stability and low absorbency to the 193 nm exposure wavelength in addition to having excellent etch resistance.

Because resists containing aromatic compounds show high absorbency to ArF (193 nm), while non-aromatic matrix resins have a poor etch resistance, these contrasting weak points are factors retarding the development of excellent photoresist films for ArF lithography.

To improve etch resistance, several approaches for increasing polymer deposition during the etch have been tested. These methods, however, run the risk of tapering profile and causing etch stop.

U.S. Pat. No. 6,319,655 B1 to Wong et al. describes aprocess for increasing the etch resistance of photoresists by exposing the photoresists to sufficient electron beam radiation. Nonetheless, the difficulties addressed by the prior art are still present.

A need, therefore, exists for stable 193 nm photoresists and a method of making the same.

SUMMARY OF THE INVENTION

It has now been found that a high energy, low-to-medium dose ion implant stabilizes 193 nm phototresists so as to overcome the problems associated with prior art methods of photoresist processing.

In accordance with the present invention, there is provided a method of making a photoresist comprising forming a photoresist layer adjacent a substrate, followed by conventional photoresist processing. Next, ions are implanted into the photoresist layer. The ion implantation during processing of the photoresist provides a stabilized photoresist and helps reduce CD loss, loss of the photoresist and formation of pin holes and striations.

The objects, advantages and features of the present invention will become more apparent from the following detailed description of the presently preferred embodiments, in conjunction with the drawings, and to the appended claims.

BRIEF DESCRIPTION OF THE FIGURES

FIGS. 1A and 1B are show the typical profile change after etching in a photoresist layer.

FIGS. 2A–2C show the profile change after etching in a photoresist layer made in accordance with the method of the present invention.

DETAILED DESCRIPTION OF THE INVENTION

The invention will now be described more fully hereinafter with reference to the accompanying drawings in which preferred embodiments of the invention are shown. While this invention is satisfied by embodiments in many different forms, there will herein be described in detail preferred embodiments of the invention, with the understanding that the present disclosure is to be considered as exemplary of the principles of the invention and is not intended to limit the invention to the embodiments illustrated and described. Numerous variations may be made by persons skilled in the art without departure from the spirit of the invention. The scope of the invention will be measured by the appended claims and their equivalents.

The present invention provides a method for stabilizing photoresists, especially 193 nm photoresists, for high aspect ratio, self-aligned contact and gate etches. The first step of the process of the present invention is the formation of the photoresist layer on a substrate. The photoresist layer may be formed using conventional techniques known to those of skill in the art. For example, a photosensitive composition is coated and dried onto a substrate. Suitable substrates include silicon, aluminum, lithium niobate, polymeric resins, silicon dioxide, doped silicon dioxide, gallium arsenide, Group III/V compounds, silicon nitride, tantalum, copper, polysilicon, ceramics, and aluminum/copper mixtures. Semiconductor substrates are most preferred. Of course, those of skill in the art will appreciate that the present invention is not limited to any particular type of substrate material and that the photoresist may be formed adjacent other layers in the semiconductor device as well.

The photosensitive compositions useful in the invention are themselves well known in the art and typically are composed of a mixture of a water-insoluble, acid-decomposable polymer that is substantially transparent to UV radiation at a wavelength of about 193 nm, a photosensitive compound capable of generating an acid upon exposure to sufficient activating energy at a wavelength of about 193 nm and other optional ingredients.

Acid decomposable polymers suitable for a chemical amplification resist film for ArF laser exposure that are substantially transparent at 193 nm are well known in the art and nonexclusively include cyclic olefins, and acrylics and methacrylates such as polyalkylacrylates and polyalkylmethacrylates, norbomene containing polymers, and alicyclic polymers. Cyclic olefin materials offer superior etch resistance, surpassing even that of novolak materials. The most widely employed route involves free radical copolymerization of maleic anhydride with a cyclic olefin monomer. The maleic anhydride serves as an oxygen-rich polar unit whose hydrophilic nature offsets the hydrophobic nature of the cyclic olefin monomer. Others polymers include, but are not limited to, polymethylacrylate and polymethylmethacrylate (PMMA), as well as copolymers thereof and polymers that have a backbone of polymethylmethacrylate having pendant groups that do not substantially reduce the transparency of the polymer at 193 nm. PMMA has a particularly high transmittance to the light of 193 nm wavelength and is known for its clarity, surface hardness, UV transparency and chemical resistance. PMMA is readily commercially available from Aldrich Chemical Company of Milwaukee, Wis. Preferably, the polymer has a molecular weight in the range of from about 1,000 to about 800,000. Alicyclic polymers include acrylate/alicyclic polymers such as hybrid polymers produced by the free radical copolymerization of norbornene, maleic anhydride and either acrylic acid or t-butyl acrylate. A terpolymer of acrylonitrile, tertiary-butyl methacrylate and methacrylic acid has also been shown to have high transparency at 193 nm and excellent dry etch resistance.

Useful photosensitive compounds capable of generating an acid upon exposure to sufficient activating energy at a wavelength of about 193 nm include onium salts such as sulfonium, diazonium and iodonium salts. Sulfonium salts are described in U.S. Pat. No. 4,537,854; diazonium salts are described in Light Sensitive Systems, Kosar, J.; John Wiley & Sons, New York (1965). Iodonium salts are described in U.S. Pat. No. 4,603,101.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040). The dye additives help provide increased resolution by inhibiting back scattering of light off the substrate. Anti-striation agents may also be used. Adhesion promoters, for example, beta-(3,4-epoxy-cyclohexyl)ethyltrimethoxysilane; p-methyl-disilane-methyl methacrylate; vinyltrichlorosilane; and gamma-amino-propyl triethoxysilane may be used.

Additionally, speed enhancers such as picric acid, nicotinic acid or nitrocinnamic acid may be used. These enhancers tend to increase the solubility of the photoresist coating in both the exposed and unexposed areas and, therefore, are used in applications when speed of development is the overriding consideration even though some degree of contrast may be sacrificed, i.e., while the exposed areas of the photoresist coating will be dissolved more quickly by the developer, the speed enhancers will also cause a larger loss of photoresist coating from the unexposed areas. Non-ionic surfactants that may be used include, for example, nonylphenoxy poly(ethyleneoxy)ethanol; octylphenoxy(ethyleneoxy) ethanol; and dinonyl phenoxy poly(ethyleneoxy)ethanol.

Photoresists that are photosensitive at 193 nm are well known in the art and widely commercially available. Such photoresists include K98 and D3 available from the Shipley Company, AM01, AM02 and AM03 available from Japan Synthetic Rubber Company, TOK ArF-41A available from Tokyo Ohka Kogyo Company Ltd., PAR 721 available from Sumitomo Corporation and AX-1050P available from Clariant.

The prepared resist solution can be applied to a substrate by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process. The thickness of the photoresist layer may vary depending on the amount of liquid photoresist composition that is applied, but typically the thickness may range from about 500 Å to about 50,000 Å and, preferably, from about 2000 Å to about 12,000 Å.

After the resist composition solution is coated onto the substrate, the photoresist may then be processed further in accordance with conventional photoresist-manufacturing processes (i.e., patterned/developed). Optionally, the photoresist may be subjected to a UV or thermal bake to reduce and control the concentration of residual solvents in the photoresist while not causing substantial thermal degradation of the photosensitizer. For example, the substrate may be temperature treated at approximately 20° C. to 200° C. In general, one desires to minimize the concentration of solvents; therefore, this temperature treatment is conducted until substantially all of the solvents have evaporated and a thin coating of photoresist composition, on the order of a micron in thickness, remains on the substrate. The temperature and time selection depends on the resist properties desired by the user, as well as the equipment used and commercially desired coating times. Commercially acceptable treatment times for hot plate treatment are up to about 3 minutes and, more preferably, up to about 1 minute. In one example, a 30 second treatment at 90° C. is useful. Treatment times increase to about 20 to about 40 minutes when conducted in a convection oven at these temperatures.

Subsequently, the photoresist layer is imagewise exposed, such as via an ArF laser or through a polysilicon etch mask, to radiation. When a chemical amplification resist is exposed to light, activated acid induces a catalytic chain reaction to a photoresist film organic polymer, generating a significant amount of protons. In the resist, protons bring a large change into the solubility of the resin. When the photoresist film is irradiated by a high energy beam, e.g., 193 nm, acid ($H^+$) is generated, which reacts with the polymer. Acid is again generated and reacts with unreacted polymer. The polymer is then dissolved in a developing solution. In contrast, the polymer at the non-exposed region maintains its structure, which is insoluble to the developing solution. With such a mechanism, a good profile pattern can be made on a wafer substrate. Exposure of the photoresist is preferably via an ArF laser, i.e., at a wavelength of from about 193 nm. When an ArF laser is used for exposure, exposure doses preferably ranges from about 1 mJ/cm$^2$ to about 10 mJ/cm$^2$, more preferably from about 2 mJ/cm$^2$ to about 8 mJ/cm$^2$.

Preferably, the process further comprises the step of heating the imagewise exposed photoresist layer prior to developing, such as by baking, for a sufficient time and temperature to increase the rate at which the acid decomposes the polymer in the imagewise exposed areas of the photosensitive composition. This drives the acid reaction for better image formation. Such a heat treatment may be conducted at temperatures of from about 50° C. to about 150° C., preferably from about 120° C. to about 150° C. for from about 30 seconds to about 2 minutes.

The development step may be conducted by immersion in a suitable developing solution. The solution is preferably agitated, for example, by nitrogen burst agitation. The substrates are allowed to remain in the developer until all, or substantially all, of the resist coating has dissolved from the irradiated areas. Typical examples of the aqueous alkaline solutions suitable as the developer include sodium hydroxide, tetramethylammonium hydroxide, or aqueous solutions of hydroxides of metals belonging to the Groups I and II of the periodic table such as potassium hydroxide. Aqueous solution of organic bases free from metal ions such as tetraalkylammonium hydroxide, for example, tetramethylammonium hydroxide (TMAH), tetraethylammonium hydroxide (TEAH) and tetrabutylammonium hydroxide (TBAH). More preferably, tetramethylammonium hydroxide (TMAH) is preferred. Furthermore, if desired, the aqueous basic solution used as the developer may additionally contain any additives such as a surface active agent in order to improve the resulting development effect. After removal of the coated wafers from the developing solution, an optional, although not required, post-development heat treatment or bake may be employed to increase the adhesion of the coating, as well as resistance to etching solutions and other substances. The post-development heat treatment can comprise the oven baking of the coating and substrate below the coating's softening point.

Next, a high-energy, low-to-medium dose of ions is implanted into the photoresist in accordance with the present invention. As a result, a carbonized crust forms on top of the photoresist, which hardens the photoresist. It appears that the ion implantation breaks the chemical bonds of the photoresist to make the carbonized layer, which, in turn, helps improve etch resistance. Suitable ions for use in the method of the present invention include, but are not limited to, argon, boron, boron fluoride, arsenic, phosphorus and nitrogen. Preferred ions are argon, boron and phosphorus. Surprisingly, it has been found that argon ions are superior in results than the other ions; therefore, argon ions are most preferred. The implanted ions preferably are high-energy (i.e., from about 15 KeV to about 100 KeV). Ion implantation according to the present invention continues until the thickness of the hardened carbonized layer on the photoresist is between about 10 and 100 nm. Preferably, the dose of ions implanted into the photoresist is in the range of from about $1 \times 10^{15}$ to about $9 \times 10^{15}$.

Ion implantation of 193 nm photoresists, in accordance with the present invention, stabilizes the photoresists and makes the photoresists more resistant to the etch chemistry of the subsequent etching step of photoresist processing. The method according to the present invention can be used to eliminate limitations for less than about 0.1 mm technologies for high aspect ratio, self-aligned contact and gate etches. It also provides a higher selectivity to etch of the underlying layers. The ion implantation also improves resist integrity and helps reduce the critical dimension loss, the loss of photoresist and the formation of pin holes and striations. Moreover, the ion implantation step of the present invention helps extend the lifetime of plasma tools and chemistry by improving photoresist quality.

The following non-limiting examples serve to illustrate the invention.

EXAMPLES

Several photoresists are made according to the following: A layer of 193 nm photoresist (Sumitomo PAR 721) is coated onto an oxide-like substrate of PSG/BPSG. A soft-bake of 110°–120° C. is used to set the fire. (A range of 90–120° C can be used—90°–110° may be preferred). The photoresist film is exposed to actinic radiation of 193 nm wavelength by a 193 nm stepper (ASML 500). The photoresist film is developed in a 2.86% aqueous TMAH (tetramethylammonium hydroxide) developer solution. The exposed areas are dissolved away, while the unexposed areas are left to form the desired resist pattern. One photoresist is left as the control ("normal resist"), while argon, boron and phosphorus ions are separately implanted into individual resists. The film thickness and CD are measured for the normal resist, as well as for those subjected to ion implantation. The resist thickness and CD for each resist are shown in Table 1. The photoresists are subjected to a post-development bake at 150° C. The film thickness and CD of the photoresists measured after the post-development bake are also listed in Table 1. As seen in Table I, the changes in resist thickness and CD in the resist made according to conventional methods (i.e., the normal resist) were much greater than the changes in resist thickness and CD in the photoresists implanted with ions according to the present invention.

TABLE 1

Change of Resist Thickness and CD

| | Resist Thickness (Tpr) | Tpr after 150° C. Bake | DICD | DICD after 150° C. Bake |
|---|---|---|---|---|
| Normal Resist | 620 nm | 440 nm | 360 nm | 0 |
| Ar Implant | 618 nm | 616 nm | 360 nm | 360 nm |
| P Implant | 510 nm | 510 nm | 486 nm | 488 nm |
| B Implant | 520 nm | 512 nm | 478 nm | 478 nm |

Additional photoresists were prepared according to the above-described process, as well as by conventional photoresist-processing methods. The typical profile change resulting from the lack of etch resistance in a photoresist made according to conventional methods can be seen in FIGS. 1A and 1B. FIG. 1A shows the resist flow at 128° C. bake, while FIG. 1B shows pattern deformation after dry etch for a 360 nm contact hole baked in conventional oven.

The results of dry etching on photoresists made according to the present invention and by conventional methods are shown in FIGS. 2A–2C. FIG. 2A shows the original contact hole pattern on BPSG film. FIG. 2B shows the contact hole pattern after dry etch on a photoresist made according to conventional photoresist-processing methods. FIG. 2C shows the contact hole pattern after dry etching in a photoresist implanted with argon ions at a dose of $5 \times 10^{15}$ ions/$cm^2$ and an energy of 50 KeV in accordance with the present invention.

What is claimed is:

1. A method of making a photoresist having increased stability, comprising:

forming a photoresist adjacent a substrate;

imagewise exposing the photoresist to activating energy at a wavelength of about 193 nm;

developing the photoresist; and implanting ions into the photoresist to thereby increase the stability and decrease shrinkage of the photoresist; wherein said ions have an energy level of 15 KeV or less.

2. The method of claim 1, wherein the ions are selected from the group consisting of argon, boron, boron fluoride, arsenic, phosphorous and nitrogen.

3. The method of claim 2, wherein the ions are argon ions.

4. The method of claim 2, wherein the ions are implanted into the photoresist at a dose in the range of about $1 \times 10^{15}$.

5. The method of claim 2, wherein the ions hay an energy level in the range of about 15 KeV.

6. The method of claim 1, wherein the exposing is conducted with an ArF laser.

7. The method of claim 6, wherein the exposing is done at an exposure dose of from about 1 $mJ/cm^2$ to about 10 $mJ/cm^2$.

8. The method of claim 1, wherein the substrate is selected from the group consisting of silicon, aluminum, lithium niobate, polymeric resins, silicon dioxide, doped silicon dioxide, gallium arsenide, Group III/V compounds, silicon nitride, tantalum, copper, polysilicon, ceramics, and aluminum/copper mixtures.

9. The method of claim 8, wherein the substrate comprises silicon.

10. The method of claim 1, wherein the step of ion implantation forms a carbonized layer on the photoresist.

11. The method of claim 10, wherein the ion implantation continues until the carbonized layer has a thickness of from about 10 to about 100 nm.

* * * * *